(12) United States Patent
Kim

(10) Patent No.: US 6,370,063 B2
(45) Date of Patent: Apr. 9, 2002

(54) WORD LINE DRIVER HAVING A DIVIDED BIAS LINE IN A NON-VOLATILE MEMORY DEVICE AND METHOD FOR DRIVING WORD LINES

(75) Inventor: Jong-jun Kim, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/768,649

(22) Filed: Jan. 24, 2001

(30) Foreign Application Priority Data

Mar. 10, 2000 (KR) ............................................. 00-11927

(51) Int. Cl.[7] .............................. G11C 16/06; G11C 7/00
(52) U.S. Cl. ............................. 365/185.23; 365/189.09; 365/189.11; 365/230.06
(58) Field of Search ....................... 365/185.18, 185.23, 365/189.09, 189.11, 230.06, 226

(56) References Cited

U.S. PATENT DOCUMENTS

| | | | | |
|---|---|---|---|---|
| 5,058,063 A | * | 10/1991 | Wada et al. ............ | 365/185.18 |
| 5,852,583 A | * | 12/1998 | Taito et al. ............ | 365/230.06 |
| 6,044,020 A | * | 3/2000 | Chung et al. .......... | 365/185.23 |
| 6,128,230 A | * | 10/2000 | Amanai ................. | 365/185.23 |
| 6,181,606 B1 | * | 1/2001 | Choi et al. ............. | 365/185.23 |

* cited by examiner

*Primary Examiner*—Son Mai
(74) *Attorney, Agent, or Firm*—Mills & Onello LLP

(57) ABSTRACT

A word line driver having a divided bias line in a non-volatile memory (NVM) device and method includes a row decoder for decoding a row address outputting a word line select signal to select a word line in response to the decoded result, and a bias supply unit for generating a first voltage includes a plurality of level shift circuits for shifting the first voltage in response to an externally applied program/erase signal during a first mode of operation and for outputting the shifted first voltage to the word line selected by the word line select signal, and a plurality of switching devices, which are switched in response to the program/erase signal, for transferring the word line select signal having a second voltage during a second mode of operation to the word line. This reduces the layout size of the NVM device by varying a voltage bias path and can improve an access speed during a data read mode of operation by minimizing word line delay.

13 Claims, 5 Drawing Sheets

FIG. 3A  ADDR
FIG. 3B  VPP
FIG. 3C  PGM/ERA
FIG. 3D  WL0

WORD LINE DRIVER HAVING A DIVIDED BIAS LINE IN A NON-VOLATILE MEMORY DEVICE AND METHOD FOR DRIVING WORD LINES

BACKGROUND OF THE INVENTION

1. Field of the Invention

The present invention relates to a non-volatile memory device (hereinafter referred to as NVM), and more particularly, to a word line driver having a divided bias line in a NVM device and a method for driving word lines.

2. Description of the Related Art

In contemporary non-volatile memory (NVM) devices, a high voltage bias is supplied to a word line through a circuit referred to as "level shift" circuit, in a case where new predetermined data are to be programmed in a cell and previously programmed data are to be erased. In the NVM device, a supply voltage, or a voltage lower than the supply voltage, are supplied to the word line as a read bias through the same level shift circuit when data stored in a memory cell are read. For this reason, in conventional NVM device, the level shift circuit must be included to provide for the high voltage bias applied during programming/erase mode of operation.

Transistors forming the level shift circuit are generally comprised of transistors operated under a high voltage and therefore implemented by elements having larger sizes. As a result, the NVM device consumes additional circuit surface area. Further, during application of bias voltage in a read mode of operation, access time must also be considered, as a delay period can be incurred as the read bias voltage passes through the same level shift circuit and is transferred to the word line. Arising from these issues, since data read speed as well as operation voltage are considered as a function of the size of the level shift circuit transistors, they are therefore implemented by transistors having relatively larger channel widths. That is, in the NVM device, when the channel widths of the level shift circuit transistors are enlarged, considering the need for faster access speed and higher operation voltage, the corresponding transistor sizes may become larger, and the layout area of the overall memory device is likewise adversely enlarged.

In conclusion, in the conventional NVM device, in which the high voltage bias and the bias during the data read mode of operation are applied through the same level shift circuit, the access speed is reduced during the data read mode of operation, and the layout area of the memory device becomes greater.

SUMMARY OF THE INVENTION

To solve the above problems, it is an object of the present invention to provide a word line driver having divided bias line in a non-volatile memory (NVM) device, which is capable of improving access speed during a data read mode of operation without enlarging the layout size.

It is another object of the present invention to provide a method for driving word lines implemented in the word line driver in the non-volatile memory (NVM) device.

Accordingly, to achieve the first object, there is provided a word line driver in a non-volatile memory (NVM) device. The NVM device includes a row decoder for inputting and decoding a row address and outputting a word line select signal to select a word line in response to a decoded result, and a bias supply unit for generating a first voltage. The word line driver includes a plurality of level shift circuits and a plurality of switching devices. The plurality of level shift circuits shift the first voltage in response to an externally applied program/erase signal during a first mode of operation and output the shifted first voltage to the word line selected by the word line select signal. The plurality of switching devices are switched in response to the program/erase signal and transfer the word line select signal having a second voltage during a second mode of operation to the word line.

In order to achieve the second object of the present invention, there is provided a method for driving word lines implemented in a word line driver in a non-volatile memory (NVM) device. The NVM device includes a row decoder for decoding a row address and selecting a word line and a bias supply unit for generating a first voltage. The method for driving word lines comprises the steps of: a) determining whether a programming/erase mode of operation is performed; b) transferring the first voltage to the word line through a first data path when the programming/erase mode of operation is performed; c) determining whether a data read mode of operation is performed when the programming/erase mode of operation is not performed in the step a); and d) transferring a second voltage to the word line through a second data path when the data read mode of operation is performed in the step c).

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF PREFERRED EMBODIMENTS

Figure 1:
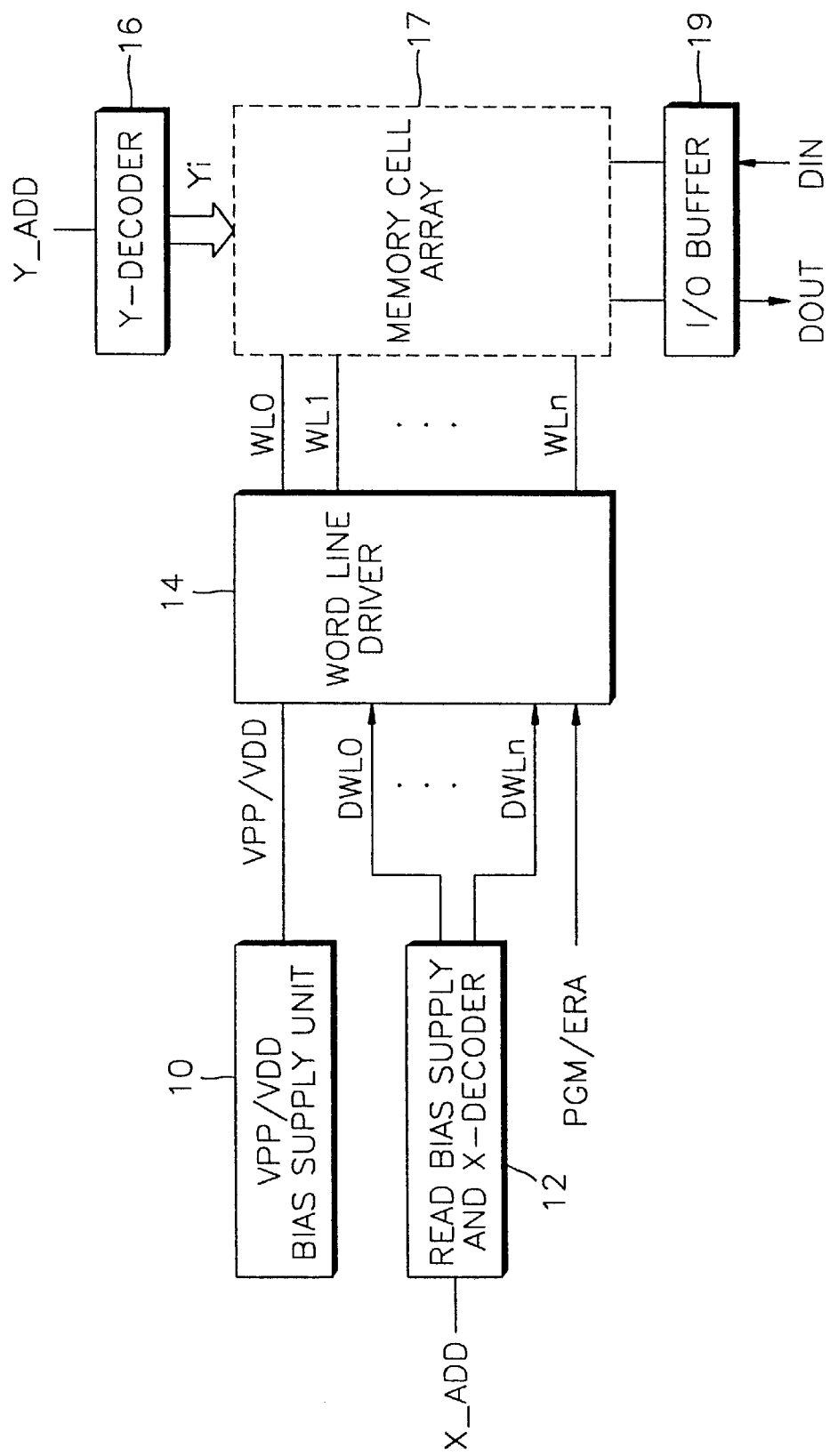
FIG. 1 is a block diagram showing a non-volatile memory (NVM) device employing a word line driver having a divided bias line according to a preferred embodiment of the present invention.

Referring to FIG. 1, the NVM device includes a VPP/VDD bias supply unit 10, a read bias supply and row decoder (X-decoder) 12, a column decoder (Y-decoder) 16, a memory cell array 17, and an I/O buffer 19.

The read bias supply and row decoder 12 inputs an externally supplied row address X_ADD, decodes the row address X_ADD, and outputs word line select signals DWL0 to DWLn. Here, the word line select signals DWL0 to DWLn have a voltage level corresponding to the supply voltage VDD, or a voltage lower than the supply voltage VDD.

The column decoder 16 inputs an externally supplied column address Y_ADD, decodes the column address Y_ADD, and outputs a column select signal Yi for selecting the column of the memory cell array 17 in response to the decoded result.

The VPP/VDD bias supply unit 10 shifts a boosting voltage VPP during a first mode of operation and supplies the shifted boosting voltage VPP to the word line driver 14. For example, the first mode of operation may denote a programming/erase mode of operation. The VPP/VDD bias supply unit 10 further supplies the supply voltage VDD to the word line driver 14.

The word line driver 14 enables a corresponding word line in response to the word line select signals DWL0 to DWLn. In addition, the word line driver 14 supplies a bias voltage, which corresponds to each mode of operation, through an enabled word line, in response to a program/erase signal PGM/ERA applied by an outer memory controller (not shown) or other control circuit (not shown). During a data read mode of operation, the word line is enabled in response to the word line select signals DWL0 to DWLn output from the data read bias supply and row decoder 12, and the read bias, that is, the supply voltage VDD, is supplied through the enabled word line. Also, during a programming/erase mode of operation, the boosting voltage VPP supplied from the VPP/VDD bias supply unit 10 is transferred as a high voltage bias through the enabled word line. The word lines WL0 to WLn enabled by the word line driver 14 are connected to gates of each cell transistor of the memory cell array 17.

The memory cell array 17 consists of a plurality of memory cells. Here, a NVM memory cell may be generally implemented by two kinds of transistors. One of them is a stack-gate type cell transistor, and the other is a split-gate type cell transistor. A floating gate exists between a gate electrode and an insulating material in each of the two types of cell transistors. Accordingly, the state of ON cell or OFF cell is formed by adjusting the quantity of electrons injected into the floating gate during the data programming/erase mode of operation. In this way, in the NVM memory cell, a high voltage signal, that is, the boosting voltage VPP, is applied through the word lines connected to the gates during the programming mode of operation for programming data, or during the erase mode of operation for erasing data. For example, in case of the split-gate type cell, a high voltage signal of about 12.5V is applied to the word line during the erase mode of operation. Here, the voltage of 0V is applied to a bit line and a source line. On the other hand, during the programming mode of operation, a high voltage of about 12.5V is applied to the source line. That is, during the programming mode of operation, the electron is injected into the floating gate region of the memory cell, and the state of OFF cell is maintained. Here, the state of data stored in the memory cell is "0". Also, during the erase mode of operation, the electrons stored in the floating gate region are caused to flow out, and the state of ON cell is maintained. Here, the state of data stored in the memory cell is "1".

The I/O buffer 19 buffers predetermined data applied through an input terminal DIN during the data programming mode of operation and transmits the buffered data into the selected memory cell of the memory cell array 17. Further, the I/O buffer 19 senses and buffers data stored in the memory cell selected during the data read mode of operation and outputs the buffered result through an output terminal DOUT.

Figure 2:
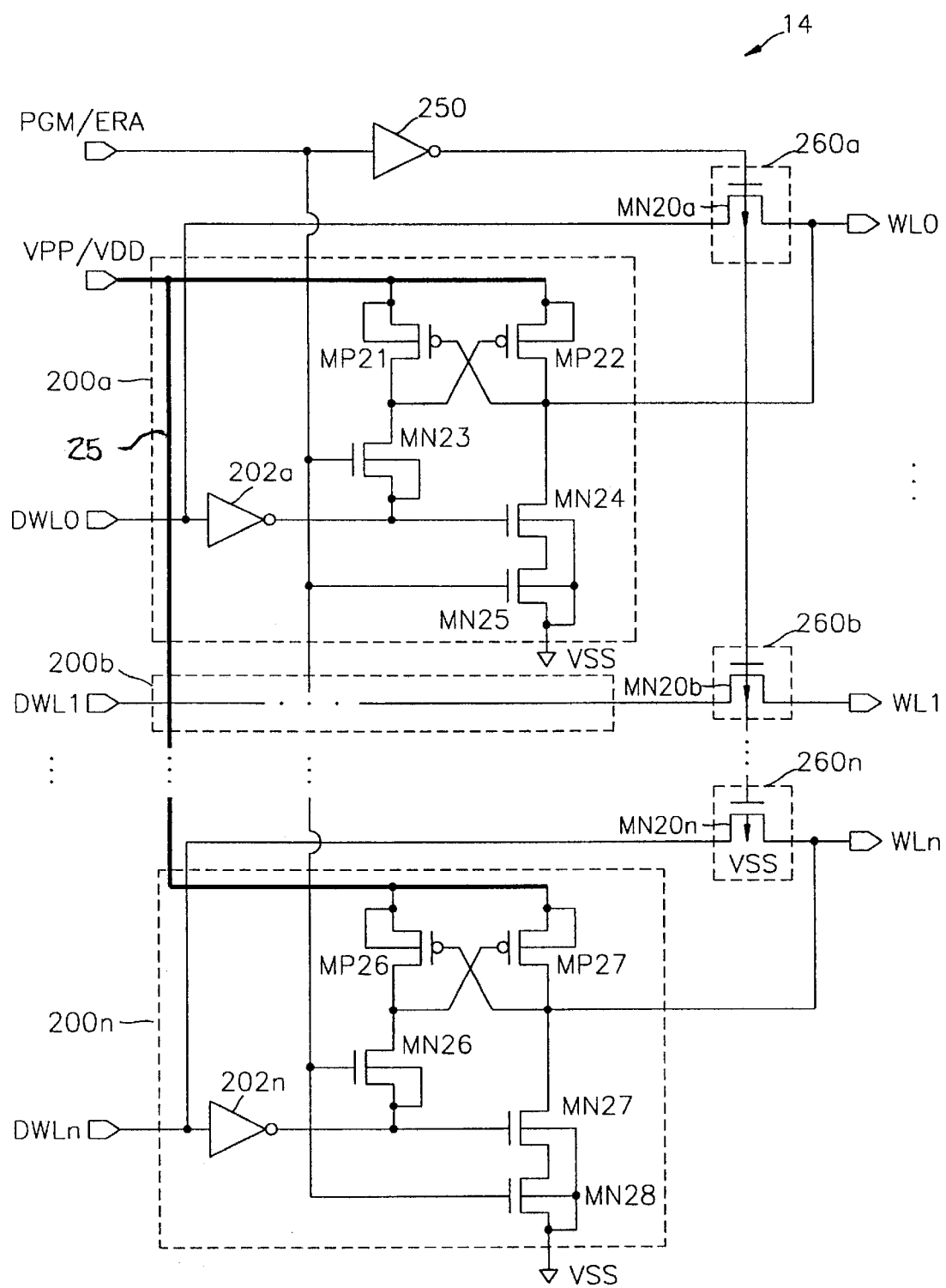
FIG. 2 is a detailed circuit diagram of the word line driver according to the preferred embodiment of the present invention.

Referring to FIG. 2, the word line driver 14 includes a plurality of level shift circuits 200a to 200n, a plurality of switching devices 260a to 260n, and an inverter 250.

The inverter 250 of FIG. 2 inverts a program/erase signal PGM/ERA applied by an external memory controller (not shown) and generates a control signal for controlling the switching devices 260a to 260n as the inverted result.

The switching devices 260a, 260b to 260n are switched in response to output signals of the inverter 250, that is, inverted a program/erase signal PGM/ERA and transfer a read bias, that is, word line select signals DWL0 to DWLn to word lines WL0 to WLn in a switch ON state. In the embodiment of FIG. 2, the switching devices 260a to 260n are implemented by NMOS transistors MN20a to MN20n. Here, preferably, the transistors MN20a to MN20n are implemented by native transistors in which a voltage drop does not exist between the drain and source while active. As another example, the switching devices 260a to 260n may be implemented by PMOS transistors. In this case, instead of the inverter 250, a non-inverting buffer may be used. In the case where the switching devices are implemented by the NMOS transistors, the output of the inverter 250 is connected to the gate of the NMOS transistor MN20a, and the source of MN20a is connected to the word line select signal, for example, DWL0, and the drain of MN20a is connected to the word line, for example, WL0. In other words, the program/erase signal PGM/ERA becomes inactive at a low level during the data read mode of operation, and the output signal of the inverter 250 becomes a high level. Accordingly, the word line select signal DWL0 by which the NMOS transistor MN20a is turned on, is transferred to the word line WL0. Here, the word line WL0 is enabled, and a data read mode of operation is performed. On the contrary, the program/erase signal PGM/ERA is enabled at a high level, and the switching device 260a is turned off during the programming/data erase modes of operation.

During the programming/erase mode of operation, the level shift circuits 200a and 200b to 200n transfer a boosting voltage VPP into a corresponding word line in response to the word line select signals DWL0 to DWLn, and the program/erase signal PGM/ERA. Reference numeral 25 of FIG. 2 denotes a voltage line to which the boosting voltage VPP or a supply voltage VDD is supplied. The level shift circuit 200a includes an inverter 202a, PMOS transistors MP21 and MP22, and NMOS transistors MN23 to MN25. Since the other level shift circuits 200b to 200n have the same structure as the level shift circuit 200a, their detailed configurations will not be described.

Referring to the level shift circuit 200a of FIG. 2, sources of the PMOS transistors MP21 and MP22 are connected to the boosting voltage VPP, and each of gates of the PMOS transistors MP21 and MP22 is connected to drains of opposite transistors. Here, the MP21 and MP22 are implemented by transistors of which size is large so as to be operated at a high voltage. Also, the PMOS transistors MP21 and MP22 may be called voltage transferring means as an integrated element.

The drain of the PMOS transistor MP22 is connected to the word line WL0, and the drain of the NMOS transistor MN23 is connected to the drain of the PMOS transistor MP21 and the gate of the PMOS transistor MP22. The source of the NMOS transistor MN23 is connected to the output of the inverter 202a. The inverter 202a inverts the word line select signal DWL0 output from the read bias supply and row decoder 12 and outputs the inverted result. The drain of the NMOS transistor MN24 is connected to the word line WL0, and the gate of the NMOS transistor MN24 is connected to the output of the inverter 202a. The drain of the NMOS transistor MN25 is connected to the source of the NMOS transistor MN24, and the gate of the NMOS transistor MN25 is connected to the program/erase signal PGM/ERA. The source of the NMOS transistor MN25 is connected to a reference potential VSS.

Here, the size of the transistors forming the level shift circuit 202a can be remarkably reduced, as compared with transistors used for a conventional level shift circuit. In other words, for the sake of improving speed during the data read mode of operation, the size of transistors in the conventional configuration must become relatively larger; on the contrary, the transistors used for the level shift circuit of the present invention must only meet internal conforming requirements. Accordingly, the size of the transistors can be reduced, and the size of the entire layout can be thereby reduced.

In more detail, the operation of the level shift circuit 200a is now described. First, during the programming/erase mode of operation, the program/erase signal PGM/ERA is enabled at a high level, and the boosting voltage VPP is applied to the level shift circuit 200a through a voltage line 25. As a result, the switching device 260a is turned off. First, when the word line select signal DWL0 is at a low level, the output of the inverter 202a becomes a high level, and the NMOS transistor MN24 is turned on. Here, the NMOS transistor MN25 is already turned on by the enabled program/erase signal PGM/ERA. Accordingly, the word line WL0 becomes a low level by the activated transistors MN24 and MN25, and is not enabled. In this state, when the word line select signal DWL0 becomes a high level, the output of the inverter 202a becomes a low level, and the NMOS transistor MN24 is thereby turned off. At this time, the NMOS transistor MN23 is turned on by the high-level program/erase signal PGM/ERA. Accordingly, the potential of a first node N1, that is, the gate of the PMOS transistor MP22 becomes a low level. The PMOS transistor MP22 is turned on by the low level voltage of the first node N1, and the boosting voltage VPP is transferred to the word line WL0 and the word line WL0 is enabled.

Also, during the data read mode of operation, a VPP/VDD bias supply unit 10 of FIG. 1 applies a supply voltage VDD (not VPP) to the level shift circuit 200a. That is, during the data read mode of operation, the program/erase signal PGM/ERA is at a low level. As a result, the switching device 260a is turned on.

Here, when the word line select signal DWL0 is at a low level, the low-level voltage is transferred to the word line WL0 through activated transistor MN20a. Thus, the word line WL0 becomes a low level and is disabled. Also, when the word line select signal DWL0 becomes a high level, the high-level voltage is transferred to the word line WL0 through the switching device 260a, that is, the turned-on transistor MN20a, and the word line WL0 is enabled. Here, the NMOS transistors MN23, MN24, and MN25 of the level shift circuit 200a do not operate and become a floating state. In this way, during the data read mode of operation, the transistors MN23, MN24, and MN25 of the level shift circuit 200a become a floating state, thereby, a path, in which a direct current (DC) flows into the reference potential VSS from the word line WL0, is shut off.

In this way, in the present invention, the boosting voltage during the programming/erase mode of operation and the read bias during the data read mode of operation are transferred to the word line through a separate path. Here, the boosting voltage VPP is transferred to the word lines WL0 to WLn through the level shift circuits 200a to 200n, and the read bias is transferred to the word lines WL0~WLn through the switching devices 260a to 260n.

FIGS. 3A through 3D are waveform diagrams illustrating the operation of a word line driver 14 shown in FIG. 2. FIG. 3A shows a low address, FIG. 3B shows the voltages of the boosting voltage/supply voltage lines VPP/VDD, FIG. 3C shows a program/erase signal PGM/ERA, and FIG. 3D shows word lines (for example, WL0).

Figure 4:
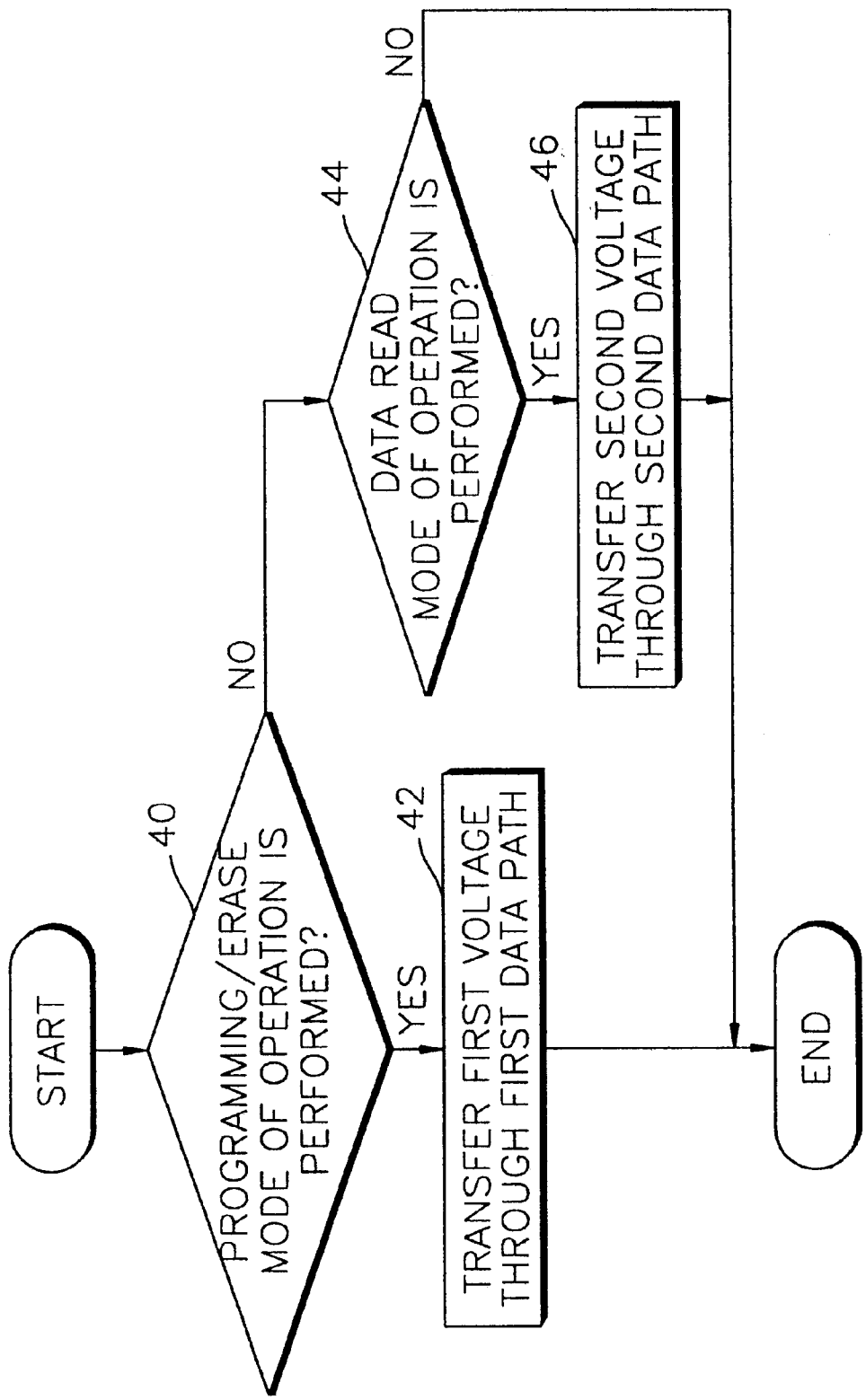
FIG. 4 is a flow diagram of a method for driving word lines implemented in the word line driver shown in FIG. 2.

FIG. 4 is a flow diagram of a method for driving word lines implemented in the word line driver 14 shown in FIG.

2. The method for driving word lines comprises the steps of: transferring a first voltage to a word line through a first data path during the programming/erase mode of operation (steps 40 to 42); and transferring a second voltage to the word line through a second data path during the data read mode of operation (steps 44 to 46).

Figure 3:
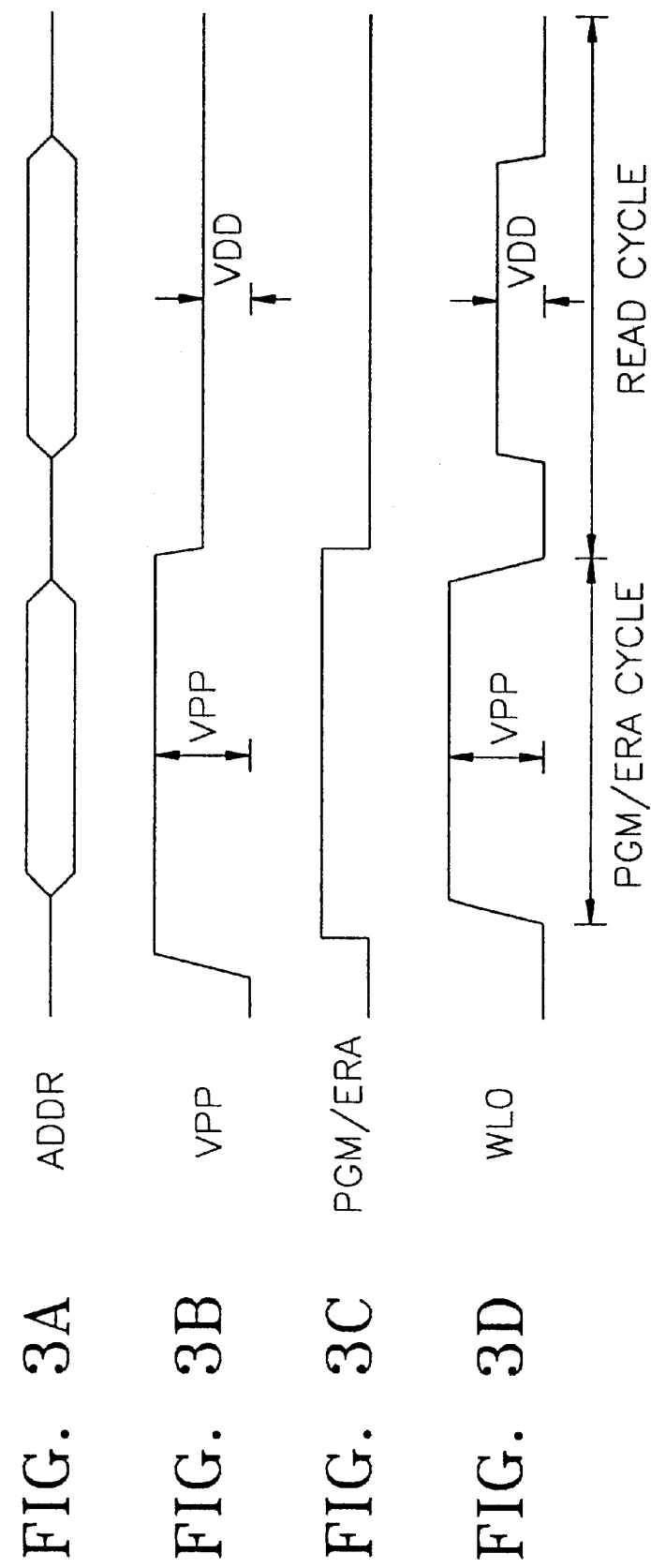
FIGS. 3A through 3D are waveform diagrams illustrating the operation of the circuit shown in FIG. 2.

The operation and driving method of the word line driver according to the embodiment of the present invention will be described with reference to FIGS. 2 through 4. First, referring to FIG. 4, it is determined whether the programming/erase mode of operation is performed (step 40). Here, the determination whether the programming/erase mode of operation is performed is made by determining whether the program/erase signal PGM/ERA of FIG. 3C is enabled at a high level. At step 40, when the program/erase signal PGM/ERA is enabled, the first voltage is transferred to the word line through the first data path (step 42). That is, the first data path denotes the level shift circuit 200a, and the first voltage denotes the boosting voltage VPP. In detail, the read bias supply and row decoder 12 (see FIG. 1) decodes a row address X_ADD shown in FIG. 3A and generates word line select signals DWL0 to DWLn. Also, the boosting voltage VPP, which is generated by the VPP/VDD bias supply unit 10, of FIG. 3B is applied through the voltage line 25 of the level shift circuit 200a. Accordingly, the boosting voltage VPP is transferred to the word line WL0 through the turned-on transistor MP22 of the level shift circuit 220a. Here, the switching device 260a is maintained in an inactive state.

On the other hand, in a case where the programming/erase mode of operation is not performed at step 40, it is determined whether the data read mode of operation is performed (step 44). When the data read mode of operation is performed at step 44, the second voltage is transferred to the word line through the second data path (step 46). That is, when the data read mode of operation is performed, the program/erase signal PGM/ERA is at a low level as shown in FIG. 3C. Here, the second data path denotes the switching device 260a, and the second voltage denotes a supply voltage VDD or a voltage lower than the supply voltage VDD. In detail, during the data read mode of operation, the word line select signal DWL0 is transferred to the corresponding word line as a read bias voltage through the switching device 260a.

Figure 5:
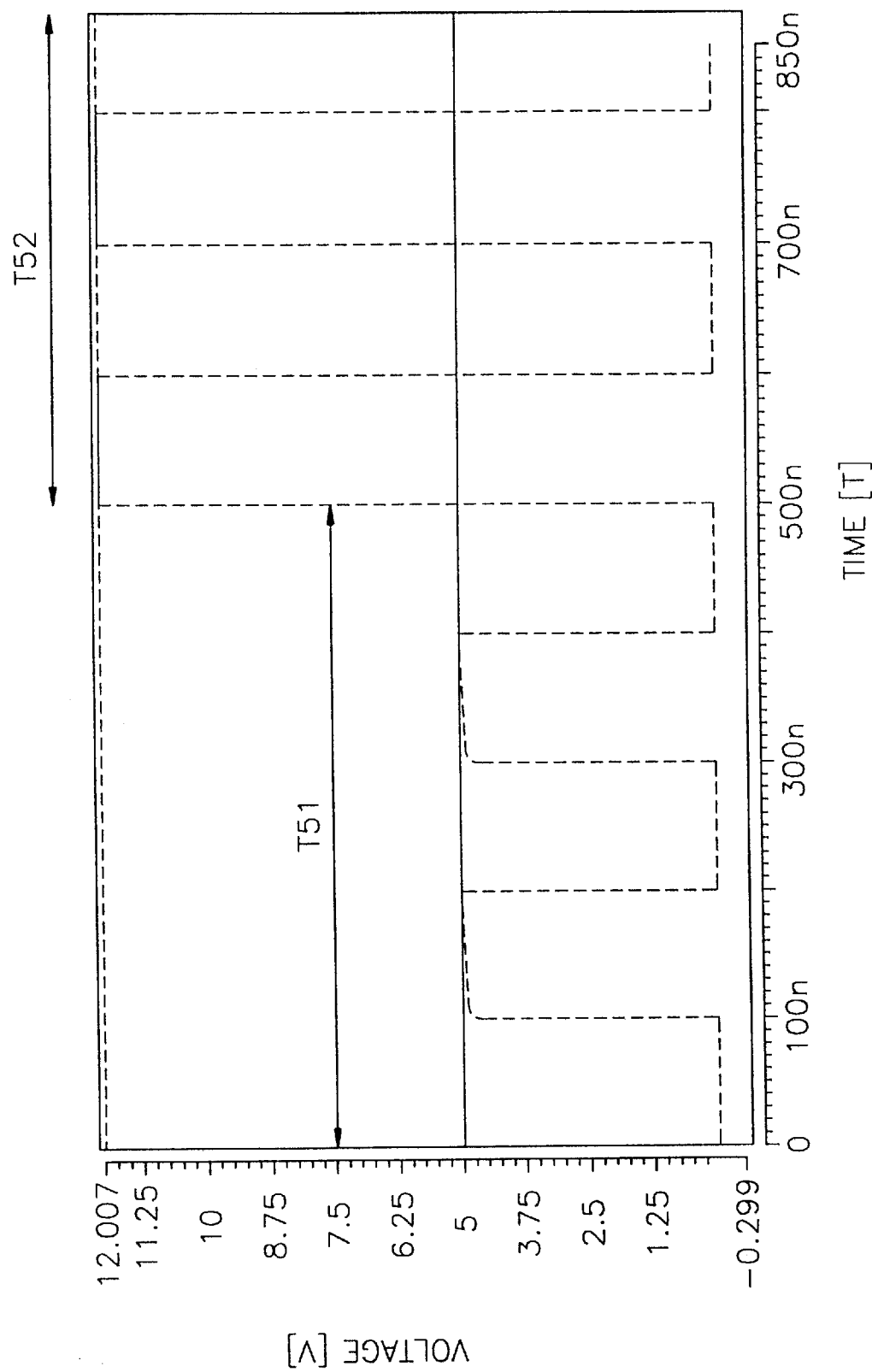
FIG. 5 is a timing diagram of the output result of the word line driver according to the present invention.

Referring to FIG. 5, an interval T51 denotes a read mode of operation, and an interval T52 denotes a programming/erase mode of operation. That is, at the interval T51, the read bias of about 5V is applied through the word line WL0, and at the interval T52, the boosting voltage VPP of about 12V is applied through the word line WL0.

As described above, the present invention can reduce the size of a level shift circuit by varying the voltage bias path, thereby reducing the layout size of a non-volatile memory (NVM) device. Also, the present invention can improve an access speed during a data read mode of operation by minimizing a word line enable delay due to the level shift circuit.

While this invention has been particularly shown and described with references to preferred embodiments thereof, it will be understood by those skilled in the art that various changes in form and detail may be made herein without departing from the spirit and scope of the invention as defined by the appended claims.

What is claimed is:

1. A word line driver in a non-volatile memory (NVM) device having a row decoder for decoding a row address and for outputting a word line select signal to select a word line in response to the decoded result, and a bias supply unit for generating a first voltage, comprising:

a plurality of level shift circuits for shifting the first voltage in response to an externally applied program/erase signal during a first mode of operation and outputting the shifted first voltage to the word line selected by the word line select signal; and a plurality of switching devices, which are switched in response to the program/erase signal, for transferring to the word line the word line select signal having a second voltage during a second mode of operation; the switching devices each comprising a native-type transistor.

2. The word line driver according to claim 1, wherein the switching devices each comprise an N-type native transistor.

3. The word line driver according to claim 1, wherein the switching devices each comprise a P-type transistor, and wherein the program/erase signal is inverted and applied as a control signal of the P-type transistor.

4. The word line driver according to claim 1, wherein the first voltage is a boosting voltage.

5. The word line driver according to claim 1, wherein the second voltage is a supply voltage.

6. The word line driver according to claim 1, wherein the second voltage is at a voltage level lower than a supply voltage.

7. The word line driver according to claim 1, wherein the plurality of level shift circuits each comprise:

an inverter for inverting the word line select signal and outputting the inverted result;

voltage transferring means for transferring the first voltage to the word line by a predetermined first node voltage;

a first transistor of which drain and source are connected between the first node and the output of the inverter, and gate is connected to the program/erase signal;

a second transistor of which gate is connected to the output of the inverter and the drain or the source is connected to the word line; and a third transistor of which drain and source are connected between the drain or the source of the second transistor and reference potentials, and gate is connected to the program/erase signal.

8. A word line driver in a non-volatile memory (NVM) device having a row decoder for decoding a row address and for outputting a word line select signal to select a word line in response to the decoded result, and a bias supply unit for generating a first voltage, comprising:

a plurality of level shift circuits for shifting the first voltage in response to an externally applied program/erase signal during a first mode of operation and outputting the shifted first voltage to the word line selected by the word line select signal, the plurality of level shift circuits each comprising:

an inverter for inverting the word line select signal and outputting
an inverted result;

voltage transferring means for transferring the first voltage to the
word line by a predetermined first node voltage;

a first transistor of which drain and source are connected between
the first node and the output of the inverter, and gate is connected to the
program/erase signal;

a second transistor of which gate is connected to the output of the
inverter and the drain or the source is connected to the word line; and a third transistor of which drain and source are connected between
the drain of the source of the second transistor and reference potentials,
and gate is connected to the program/erase signal; and a plurality of switching devices, which are switched in response to the program/erase signal, for transferring to the word line the word line select signal having a second voltage during a second mode of operation.

9. The word line driver according to claim 8, wherein the switching devices comprise an N-type native transistor.

10. The word line driver according to claim 8, wherein the switching devices comprise a P-type transistor, and wherein the program/erase signal is inverted and applied as a control signal of the P-type transistor.

11. The word line driver according to claim 8, wherein the first voltage is a boosting voltage.

12. The word line driver according to claim 8, wherein the second voltage is a supply voltage.

13. The word line driver according to claim 8, wherein the second voltage is at a voltage level lower than a supply voltage.

* * * * *